(12) United States Patent
Cheah et al.

(10) Patent No.: US 11,482,481 B2
(45) Date of Patent: Oct. 25, 2022

(54) SEMICONDUCTOR DEVICE AND SYSTEM

(71) Applicant: Intel Corporation, Santa Clara, CA (US)

(72) Inventors: Bok Eng Cheah, Bukit Gambir (MY); Jackson Chung Peng Kong, Tanjung Tokong (MY); Kooi Chi Ooi, Glugor (MY); Lee Fueng Yap, Gelugor (MY); Chan Kim Lee, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 16/888,155

(22) Filed: May 29, 2020

(65) Prior Publication Data

US 2021/0098350 A1    Apr. 1, 2021

(30) Foreign Application Priority Data

Sep. 27, 2019 (MY) .............................. 2019005712

(51) Int. Cl.
*H05K 1/18*  (2006.01)
*H01L 23/498*  (2006.01)
*H01L 25/16*  (2006.01)
*H01L 25/18*  (2006.01)

(52) U.S. Cl.
CPC .. *H01L 23/49816* (2013.01); *H01L 23/49833* (2013.01); *H01L 25/162* (2013.01); *H01L 25/18* (2013.01); *H05K 1/181* (2013.01); *H05K 1/183* (2013.01); *H05K 2201/10015* (2013.01); *H05K 2201/1053* (2013.01); *H05K 2201/10363* (2013.01)

(58) Field of Classification Search
CPC . H01L 23/49816; H01L 25/162; H01L 25/18; H01L 23/49833; H05K 1/181; H05K 1/183; H05K 2201/1053; H05K 2201/10015; H05K 2201/10363; H05K 1/0231
USPC ................. 361/770–790, 795, 803; 257/690
See application file for complete search history.

(56) References Cited

U.S. PATENT DOCUMENTS

| | | | |
|---|---|---|---|
| 5,402,088 A * | 3/1995 | Pierro ..................... | H01P 5/085 333/33 |
| 7,863,735 B1 * | 1/2011 | Cho ....................... | H01L 25/105 257/723 |
| 8,891,246 B2 * | 11/2014 | Guzek ............... | H01L 23/49816 361/766 |
| 9,826,623 B2 * | 11/2017 | Koukami ............... | H05K 3/284 |
| 2003/0087538 A1 * | 5/2003 | Ueno ...................... | H01L 24/82 439/68 |
| 2009/0322149 A1 * | 12/2009 | Kishibata ............... | H05K 1/148 307/10.1 |
| 2017/0086298 A1 * | 3/2017 | Chuah .................. | H05K 1/0231 |
| 2018/0005984 A1 * | 1/2018 | Yu ........................... | H01L 24/03 |

(Continued)

FOREIGN PATENT DOCUMENTS

WO    WO-2019132971 A1 *  7/2019  ............. H01L 25/50

*Primary Examiner* — Tuan T Dinh
(74) *Attorney, Agent, or Firm* — Schwegman Lundberg & Woessner, P.A.

(57) ABSTRACT

An electronic device is disclosed. In one example, the electronic device includes a circuit board comprising a recess a package in the recess, a semiconductor die coupled to the first side of the package, and a bridge extending from the first side of the package to the circuit board wherein the bridge electrically couples the package to the circuit board.

11 Claims, 7 Drawing Sheets

(56) References Cited

U.S. PATENT DOCUMENTS

| | | | |
|---|---|---|---|
| 2019/0006333 A1* | 1/2019 | Ong | H01L 25/16 |
| 2019/0057915 A1* | 2/2019 | Starkston | H01L 23/5385 |
| 2019/0067207 A1* | 2/2019 | Hu | H01L 23/552 |
| 2019/0131232 A1* | 5/2019 | Lee | H01L 24/16 |
| 2019/0181097 A1* | 6/2019 | Cheah | H01L 23/552 |
| 2019/0259704 A1* | 8/2019 | Kong | H01L 25/18 |
| 2019/0267336 A1* | 8/2019 | Raorane | H01L 23/66 |
| 2019/0295968 A1* | 9/2019 | Bayrakci | H01L 23/147 |
| 2020/0008302 A1* | 1/2020 | Jain | H01L 23/49827 |
| 2020/0075469 A1* | 3/2020 | Lin | H01L 24/27 |
| 2020/0235478 A1* | 7/2020 | Kitamura | H01Q 1/38 |

* cited by examiner

SEMICONDUCTOR DEVICE AND SYSTEM

This application claims the benefit of priority to Malaysian Application Serial No. PI 2019005712, filed Sep. 27, 2019, which is incorporated herein by reference in its entirety.

TECHNICAL FIELD

Embodiments described herein generally relate semiconductor packaging.

BACKGROUND

Conventional transmission lines run from semiconductor dies, down through printed circuit boards, and back up to components. These transmission lines are long. It is desired to have electrical configurations that address these concerns, and other technical challenges.

DESCRIPTION OF EMBODIMENTS

Figure 1A:
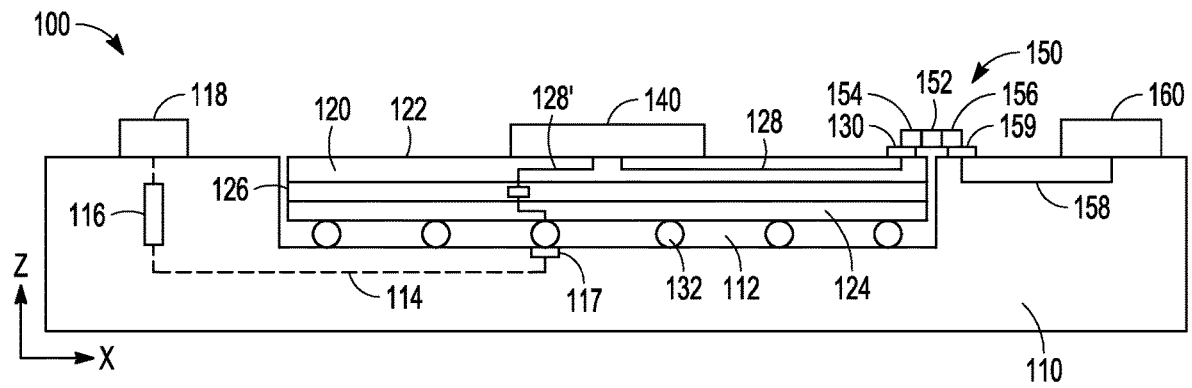
FIGS. 1A-1B are a schematic diagrams of a semiconductor package with lateral interconnects in accordance with some example embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In recess-in-motherboard (RiMB) design semiconductors, semiconductor dies are disposed on a package in a recess of the printed circuit board (PCB). This scheme is commonly used with central processing units (CPU) or platform controller hub (PCH) semiconductor dies. The RiMB scheme allows for ultra-thin and miniaturized platforms.

But RiMB designs increase transmission line distance. This is caused in part by the transmission line travelling through various mediums, such as ball-grid arrays (BGA), PCB traces, plated through holes (PTH) or micro-via, to connect the semiconductor die package to another electronic component (e.g., an active memory device or passive component) on the PCB outside the recess. This causes increased power loop inductance and channel impedance discontinuities, such as reflection noise along vertical transitions. This can additionally reduce signal and power integrity for devices using RiMB circuit boards by increasing power supply noise, signaling jitters, and performance degradation.

Proposed is a type of recess by-pass interconnect (a "bridge" in some examples) for a semiconductor package. The interconnects are package-to-board side lateral interconnects. In an example embodiment, decoupling capacitors are used to bridge the package to the PCB in conjunction with a solder layer to send the transmission line or power delivery network on the opposite side of the package.

The proposed architecture using a recess by-pass interconnect allows for improved power integrity, improved signal integrity, and increased platform miniaturization.

Improved power integrity is reached by reducing power loop inductance between the silicon semiconductor die package and on-board decoupling capacitors or voltage regulators. This can occur from the extension of the recess by-pass interconnect (e.g., a bridge using a decoupling capacitor) extending across from the semiconductor die package top side to a top side of the PCB outside of the recess in which the semiconductor die package resides. This increases the periphery area, facilitating additional direct decoupling capacitors placement between the semiconductor die package and the PCB for power supply noise (PSN) reduction.

Improved signal integrity can be achieved for high speed input output (I/O) set-ups through a shorter transmission line. Additionally, channel impedance mismatches can be reduced by avoiding multiple non-ideal vertical path transitions such as PTH or BGA interconnects and the availability of series AC capacitor coupling for channel performance scaling. Such high speed I/O set-ups can include, for example, universal serial bus (USB) 3.2, peripheral component interconnect (PCI) Express, thunderbolt (TBT), or Ethernet serializer/deserializer (SerDes) configurations.

Platform miniaturization can be accomplished through increased device integration (e.g., compactness). For example, a bridge type recess by-pass interconnect can include one or more silicon devices disposed within the footprint of the PCB recess. Additionally, a shorter power loop inductance can increase power distribution network (PDN) coupling efficiency, reducing the number of decoupling capacitors needed on the PCB.

Figure 1B:
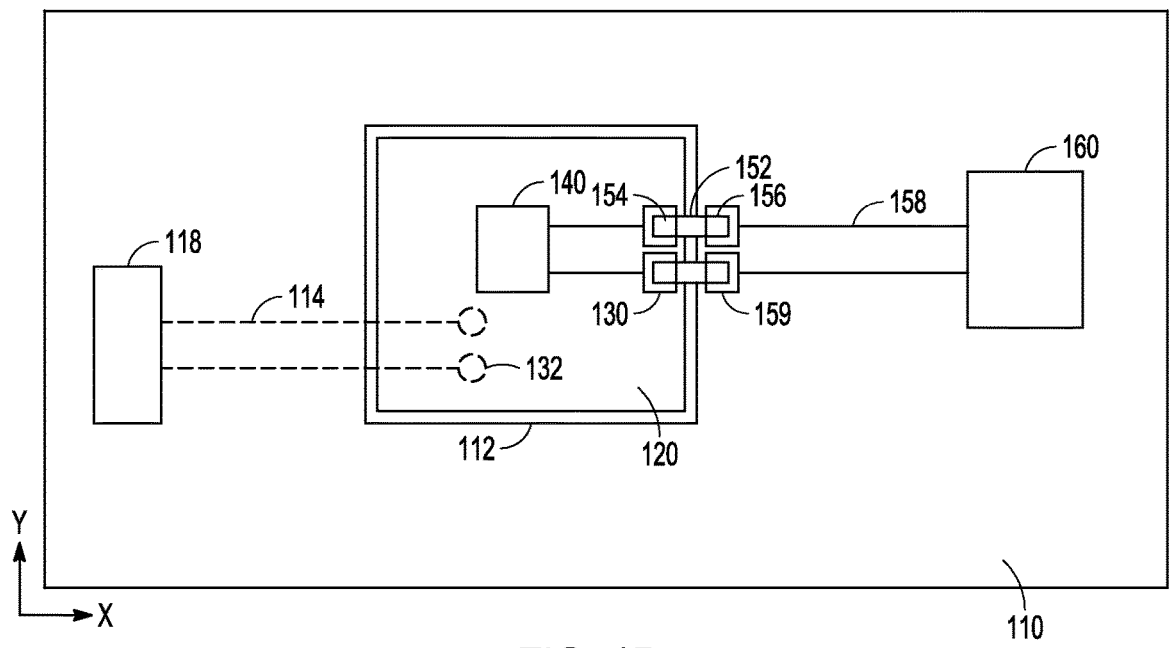

FIGS. 1A-1B are a schematic diagrams of a semiconductor assembly 100 with lateral interconnects 150 in accordance with some example embodiments. Assembly 100 has package to PCB top side lateral interconnects for improved electrical performance and device miniaturization. FIG. 1A shows a side view, while FIG. 1B shows a top-down view. FIGS. 1A-1B will be discussed together.

Semiconductor assembly 100 includes printed circuit board (PCB) 110 with recess 112, traces 114, via 116, pads 117, and component 118, package 120 with first side 122, second side 124, core layer 126, trace 128, package pads 130, and solder balls 132, semiconductor die 140, bridge 150 containing capacitor 152 with terminals 154, traces 158, pad 159, and device 160.

Components 118 and 160 are mounted on PCB 110. Recess 112 is cut into PCB 110. Package 120 resides within recess 112. Package 120 hosts die 140. Die 140 is electrically connected to component 118 through package traces 128, solder balls 132, pads 117, PCB traces 114, and via 116. Die is electrically connected to device 160 through package traces 128, package pads 130, bridge 150, PCB pads 159, and PCB traces 158.

Printed circuit board 110 with recess 112 can be, for example, a PCB that mechanically and electrically supports components in assembly 100. PCB 110 can contain single, double, or multiple layers. PCB 110 can host traces (such as traces 114) of conductive material (e.g., copper trace), in addition to pads (such as pads 117 and 159) of conductive material to allow for electrical connection. PCB 110 can additionally host vertical connectors, such as, for example, via, micro-via, or plated through holes (PTH)) (e.g., via 116).

Component 118 is mounted to (e.g., soldered to) PCB 110. Component 118 can be an active or passive component. Component 118 can be, for example, a connector, a voltage regulator, an inductor, a resistor, a processing device, or other component disposed on and/or within PCB 110. Component 118 can be mounted to PCB 110 thought a plurality of solder balls (not shown). Component 118 is electrically connected to package 120 through PCB pads 117, traces 114, and via 116.

Device 160 can be mounted to (e.g., soldered to) PCB 110. Device 160 can be an active or passive component. Device 160 can be, for example, a memory device, a transceiver device, a SerDes device, a field programmable gate array (FPGA) device, a connector, a voltage regulator, or other device disposed on and/or within PCB 110. Device 160 can be mounted to PCB 110 thought a plurality of solder balls (not shown). Device 160 is electrically connected to package 120 through PCB trace 158, pads 159 and bridge 150.

Package 120 resides within recess 112 of PCB 110. The recess 112 extends into PCB 110. The recess 112 can have a footprint, for example, where the ratio of the recess 112 footprint to a package 120 footprint ranges from about 1.1:1 to 2:1. The recess 112 can have a depth comparable to the package 120 thickness, optionally including the thickness of any solder on the bottom surface of package 120.

Package 120 can be, for example, a semiconductor package hosting a semiconductor die such as die 140. Package 120 can have first side 122 opposite second side 124, separated by a core layer 126. Package 120 can be connected to PCB 110 by solder balls 132.

The package 120 can be coupled to the PCB 110 through package trace 128 and package pads 130. These traces 128 and pads 130 can allow for electrical connection from package 120 through PCB 110 to electronic components mounted on PCB 110 (e.g., device 160).

Solder balls 132, can be, for example, a ball grid array (BGA) made of conductive solder in an appropriate pattern to create electrical connections. Solder balls 132 can be connected to traces in PCB 110 via solder ball pads 117, made of a conductive material. The BGA can be underfilled with an appropriate adhesive, such as, for example, epoxy or other adhesive as known in the art.

Semiconductor die 140 is mounted on package 120. Die 140 can be, for example, a central processing unit (CPU), a platform controller hub (PCH), a chipset, a graphic die, a memory die, or other semiconductor die. Semiconductor die 140 is coupled to first side 122 of package 120 through a plurality of solder bumps (not shown).

Bridge 150 electrically connects semiconductor die 140 to device 160 with a shorter transmission line compared to the connection between semiconductor die 140 and component 118. Bridge 150 creates a package 120 to PCB 110 top side lateral interconnect. Bridge 150 can be made of, for example one or more capacitors extending over package pads 130 at the periphery of package 120 and PCB pads 159.

In assembly 100, bridge 150 contains decoupling capacitor 152. Decoupling capacitor 152 can have terminal 154 and 156. First terminal 154 can be coupled to first side 122 of package 120. Second terminal 156 can be coupled to trace 158 in the surface of PCB 110 via pad 159. Trace 158 electrically connects bridge 150 to device 160, such as a memory device or different component discussed above, mounted on PCB 110.

Decoupling capacitor 152 in bridge 150 can form part of a transmission line (e.g., AC coupled interconnects). Alternatively, decoupling capacitor can be part of a power delivery network where terminals 154 and 156 are associated to reference voltages opposite in polarity. In this embodiment, first terminal 154 is associated or coupled to a ground (Vss) reference voltage, such as through a ground plane. Second terminal 156 is associated or coupled to a power (Vcc) reference voltage, such as through a power plane.

In some examples, decoupling capacitor 152 is a multi-layer ceramic capacitor (MLCC, see FIGS. 3A-3B, and 4), or alternatively a silicon capacitor. In some examples, bridge 150 can contain an array or a plurality of decoupling capacitors 152 (see FIGS. 2A-2B). A plurality of capacitors 152 in bridge 150 can be of varying dimensions (see FIG. 6).

In some examples, bridge 150 can contain circuitry component such as a re-timer or a re-driver device to preserve signal integrity of high-speed interfaces, for example, universal serial bus (USB) 3.2, peripheral component interconnect (PCI) Express, thunderbolt (TBT), or Ethernet serializer/deserializer (SerDes).

Figure 2A:
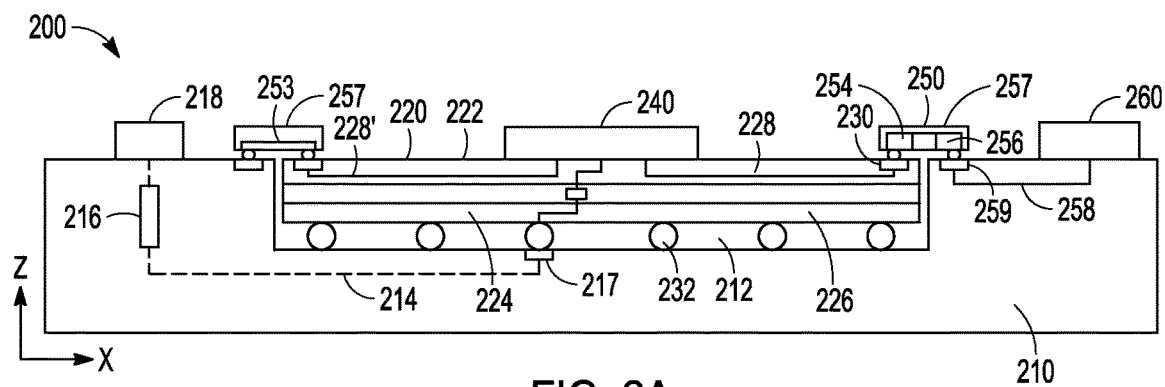
FIGS. 2A-2B are a schematic diagrams of a semiconductor package with molded lateral interconnects in accordance with some example embodiments.
Figure 2B:
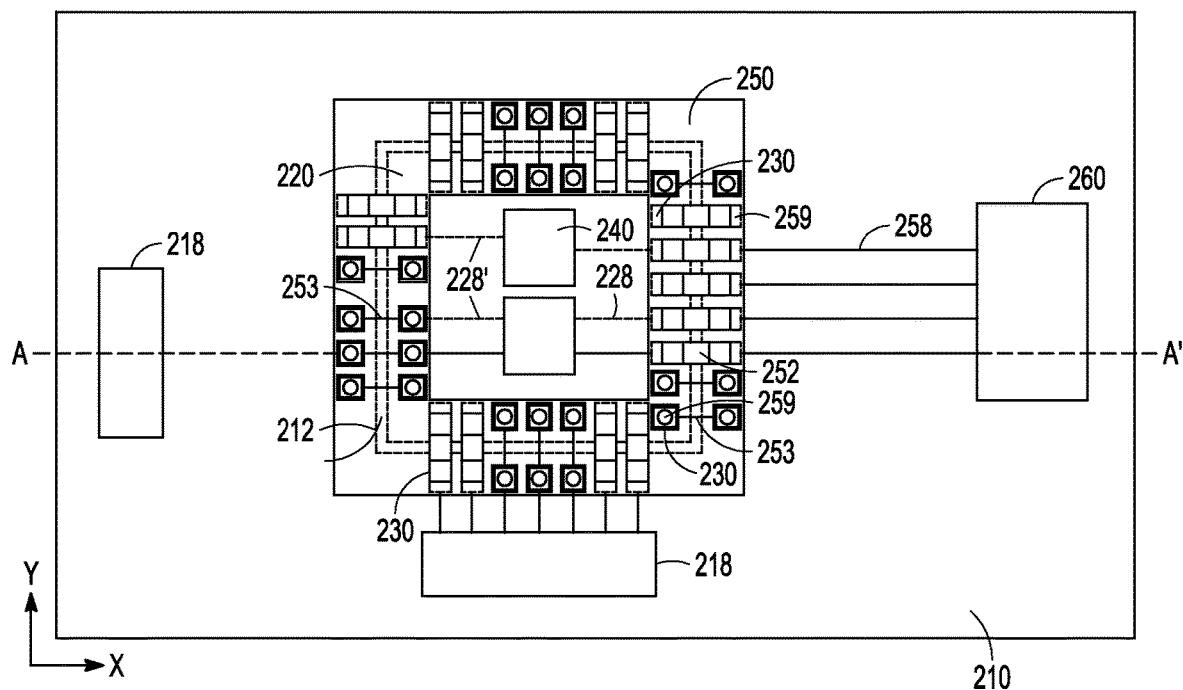

FIGS. 2A-2B are a schematic diagrams of a semiconductor assembly 200 with molded lateral interconnects 250 in accordance with some example embodiments. FIG. 2A shows a side view, while FIG. 2B shows a top-down view. FIGS. 2A-2B will be discussed together.

Semiconductor assembly 200 includes printed circuit board (PCB) 210 with recess 212, traces 214, via 216, pads 217, and component 218, package 220 with first side 222, second side 224, core layer 226, package trace 228, package pads 230, and solder balls 232, semiconductor die 240, bridge 250 containing capacitor 252 with terminals 254, 256, traces 258, pad 259, and device 260. Semiconductor package 200 includes similar components, connected in a similar manner, to those described in reference to FIGS. 1A-1B, except where otherwise noted.

In FIGS. 2A-2B, bridge 250 includes a mold layer 257 and an array of decoupling capacitors 252. As seen in the top-down view of FIG. 2B, the array of capacitors 252 can be at least partially disposed within mold layer 257, and encircling semiconductor dies 240. The plurality of decoupling capacitors 252 in bridge 250 can each be used to create different, varying, alternative, or additive transmission paths. In some examples, only some of the plurality of decoupling capacitors 252 in bridge 250 are used for electrical connections. This allows some flexibility in electrically connecting semiconductor die 240 to various components 218, 260 on the surface of the PCB 210.

In addition to decoupling capacitors 252, bridge 250 can contain conductive traces 253. Conductive traces 253 can be etched into the material of bridge 250 to provide additional electrical connections where capacitors are unavailable.

Conductive traces 253 are coupled to the semiconductor die 240 through package traces 228'. In some examples, the width of conductive traces 253 can be, for example, about 5 micro-meter (μm) to about 80 μm. In some examples, conductive traces 253 facilitate electrical data transmissions for high-speed interfaces such as Ethernet SerDes, USB3.2, TBT or PCI Express between package 220 and PCB 210. Signal integrity of high-speed data transmission between semiconductor die 240 and components 218, 260 can be preserved through conductive traces 253 that provide reduced interconnect losses and channel impedance discontinuities.

Figure 3A:
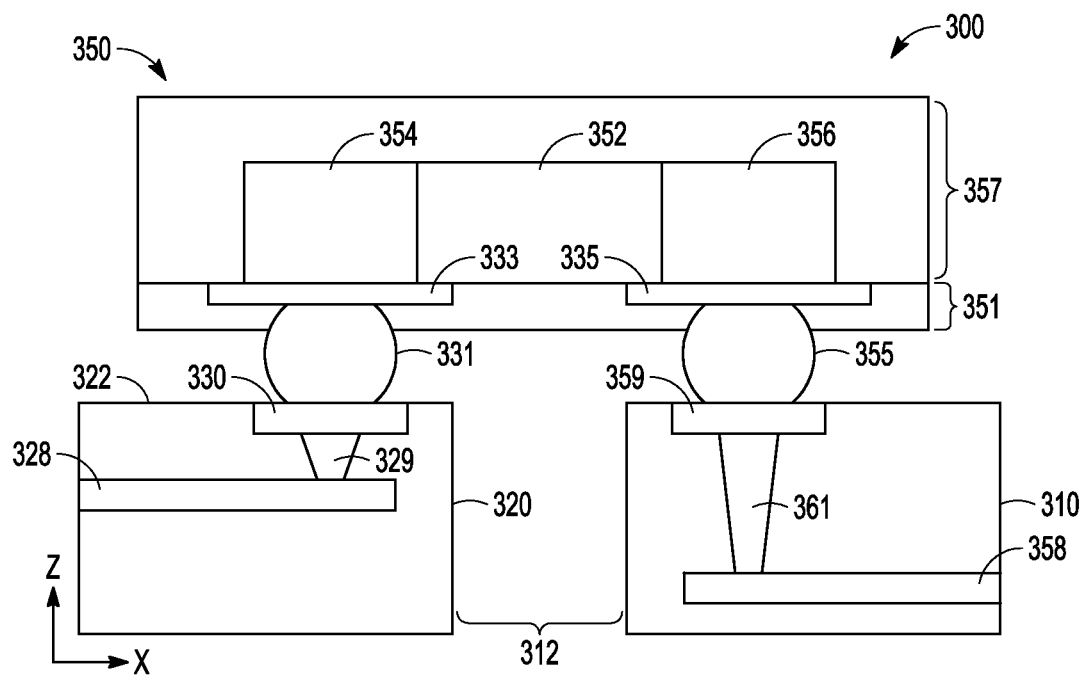
FIGS. 3A-3B are schematic diagrams of package to board molded lateral interconnects in accordance with some example embodiments.
Figure 3B:
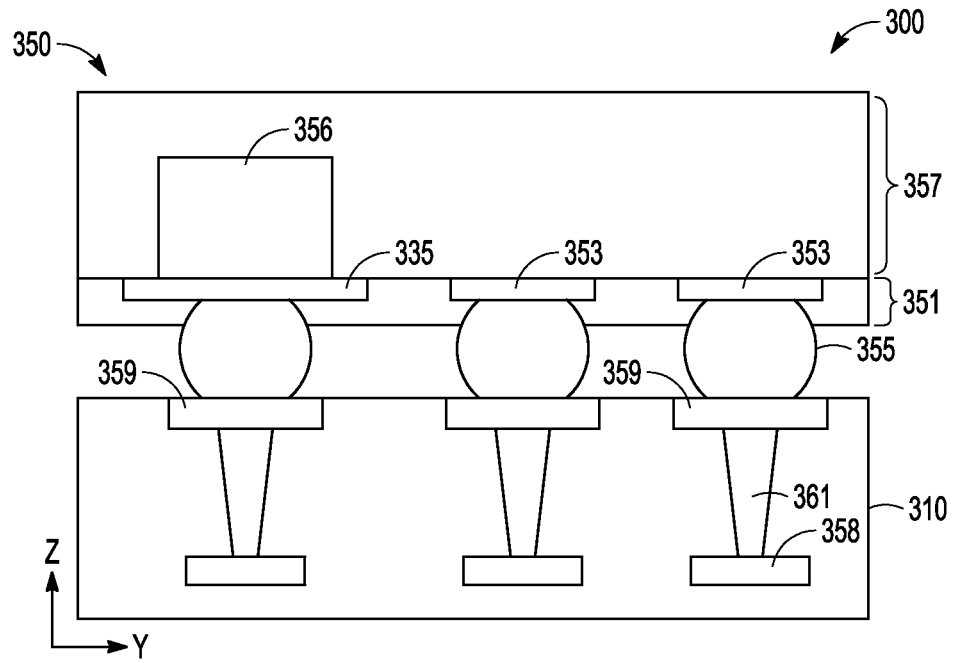

FIGS. 3A-3B are schematic diagrams of package to printed circuit board molded lateral interconnects in accordance with some example embodiments. Assembly 300 includes package 320 with top side 322, package traces 328, package via 329, package pad 330, solder ball 331, bridge 350 with metallic layer 351 containing pads 333 and 335, capacitor 352 with terminals 354 and 356, and molded layer 357, PCB 310, pad 359, PCB via 361, and PCB trace 358. The components in FIGS. 3A-3B are similar to the corresponding components in FIGS. 1A-1B and 2A-2B, except where otherwise noted.

In assembly 300, bridge 350 is mounted on package 320 and PCB 310, electrically connecting traces in package 320 to traces in PCB 310. The transmission line runs from package trace 328 up package via 329 and package pad 330 to solder ball 331, through pad 333 in metallic layer 351 to first terminal 354 of capacitor 352 (situated in molded layer 357) to second terminal 356 of capacitor 352, to solder ball 355 through pad 335, down PCB pad 359 and PCB via 361 to PCB trace 358.

In assembly 300, bridge 350 includes both molded layer 357 and metallic layer 351. The molded layer 357 includes one or more capacitors 352. The capacitors 352 are coupled to at least a portion of the traces 328, 358. The metallic layer 351 can include a plurality of conductive traces or interconnects (e.g., conductive traces 353) and contact pads (e.g., pads 333, 335). The bridge 350 can be coupled to the package 320 through a plurality of solder balls 331, 355, such as micro-solder balls. The diameter of micro-solder balls can be, for example, about 20 μm to about 200 μm.

Figure 4:
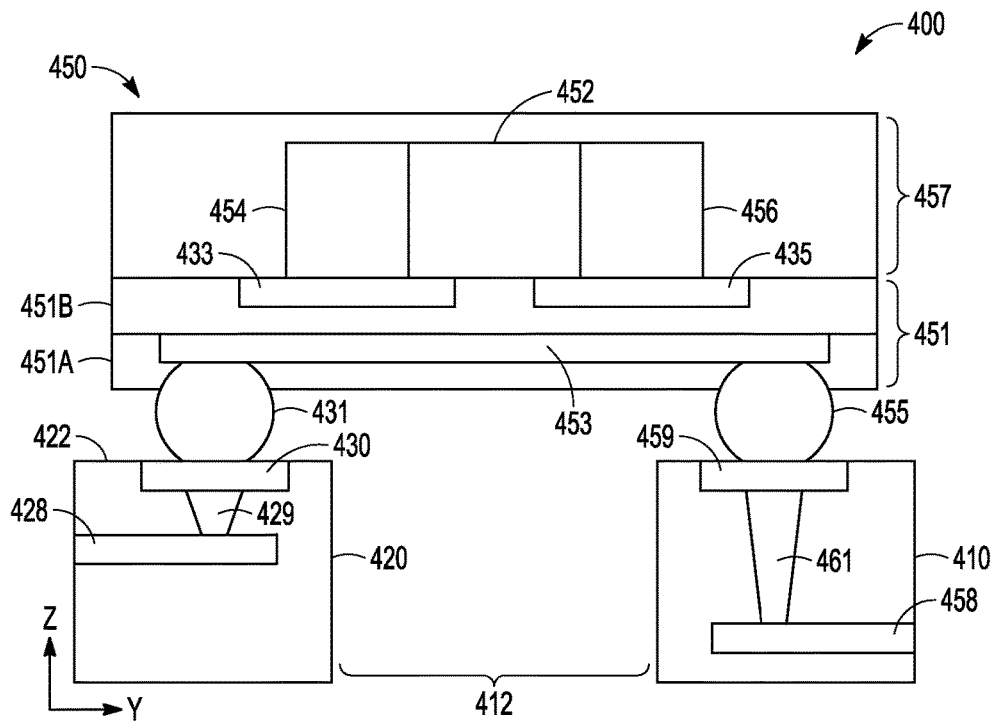
FIG. 4 is a schematic diagram of a package to board molded lateral interconnect in accordance with some example embodiments.

FIG. 4 is a schematic diagram of a package to board molded lateral interconnect in accordance with some example embodiments. Semiconductor assembly 400 includes package 420 with top side 422, package traces 428, package via 429, package pad 430, solder ball 431, bridge 450 with metallic layer stack 451 (with layers 451a, 451b) containing pads 433 and 435, and molded trace 453, capacitor 452 with terminals 454 and 456, and molded layer 457, PCB 410, solder ball 455, contact pad 459, PCB via 461, and PCB trace 458. The components in assembly 400 are similar to, and connected in the same fashion, as the corresponding components discussed with reference to FIGS. 3A-3B, except where noted.

Bridge 450 in assembly 400 contains a metal layer stack 451 instead of a singular metallic layer (see, e.g., FIGS. 3A-3B). The metallic layer stack 451 contains two layers 451a, 451b, made of a dielectric material. Embedded in the first layers 451a is a molded trace 453. Contact pads 433, 435 are embedded in the second layer 451b. Capacitor 452 and molded layer 457 lie on top of metallic layer stack 451. In some examples, contact pads 433, 435 are coupled to molded trace 453 through micro-via (not shown). Metal layer stack 451 facilitates signal routing redistribution by allowing for routing through varying conductive pads, traces, or capacitors in multiple layers.

Figure 5:
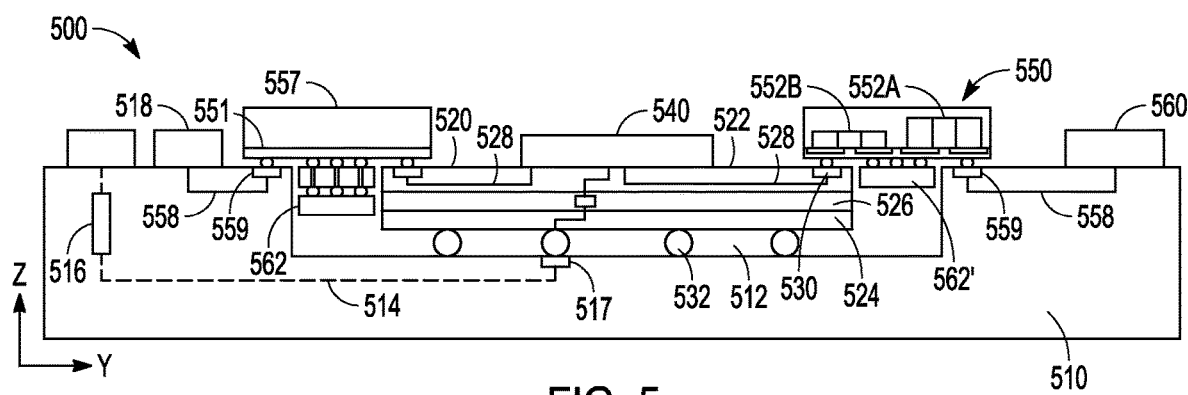
FIG. 5 is a schematic diagram of a package with molded lateral interconnects with reverse mounted components in accordance with some example embodiments.

FIG. 5 is a schematic diagram of a package 500 with molded lateral interconnects 550 with reverse mounted components in accordance with some example embodiments. Semiconductor package 500 includes printed circuit board (PCB) 510 with recess 512, traces 514, via 516, pads 517, and components 518, package 520 with first side 522, second side 524, core layer 526, package trace 528, package pads 530 and solder balls 532, semiconductor die 540, bridge 550 containing capacitors 552a, 552b, metallic layer 551, molded layer 557, and reverse stacked dies 562; in addition to traces 558, pad 559, and device 560. The components of assembly 500 are similar to, and connected in the same fashion, as the corresponding components in FIGS. 1A-1B and 2A-2B, except where otherwise noted.

Bridge 550 is a molded frame that encircles semiconductor die 540. In some embodiment, molded frame bridge 550 can partially encircle semiconductor die 540. Bridge 550 can include a molded layer 557 sitting on a metallic layer 551, similar to the corresponding components discussed with reference to FIGS. 3A-3B and 4. Similarly, bridge 550 can contain capacitors 552 and/or conductive traces 553.

Bridge 550, however, can include reverse attached stacked dies 562. Reversible stacked dies 562 are mounted on the metallic layer 551 opposite molded layer 557. Dies 562 can be, for example, a memory device, an I/O tile, a transceiver device, a power management device, or other silicon dies. The reversible stacked dies 562 can be active or passive components, and can reside within the recess 512. The dies 562 can be coupled (through metallic layer 551) to PCB 510 and/or a component mounted on PCB 510, such as components 518, 560. In some examples, bridge 550 can include one or more single die 562' mounted on the metallic layer 551 in planar (e.g., into y-axis). In some examples, the reversible stacked dies 562 and one or more planar die 562' are coupled to capacitors 552a, 552b through metallic layer 551.

Figure 6:
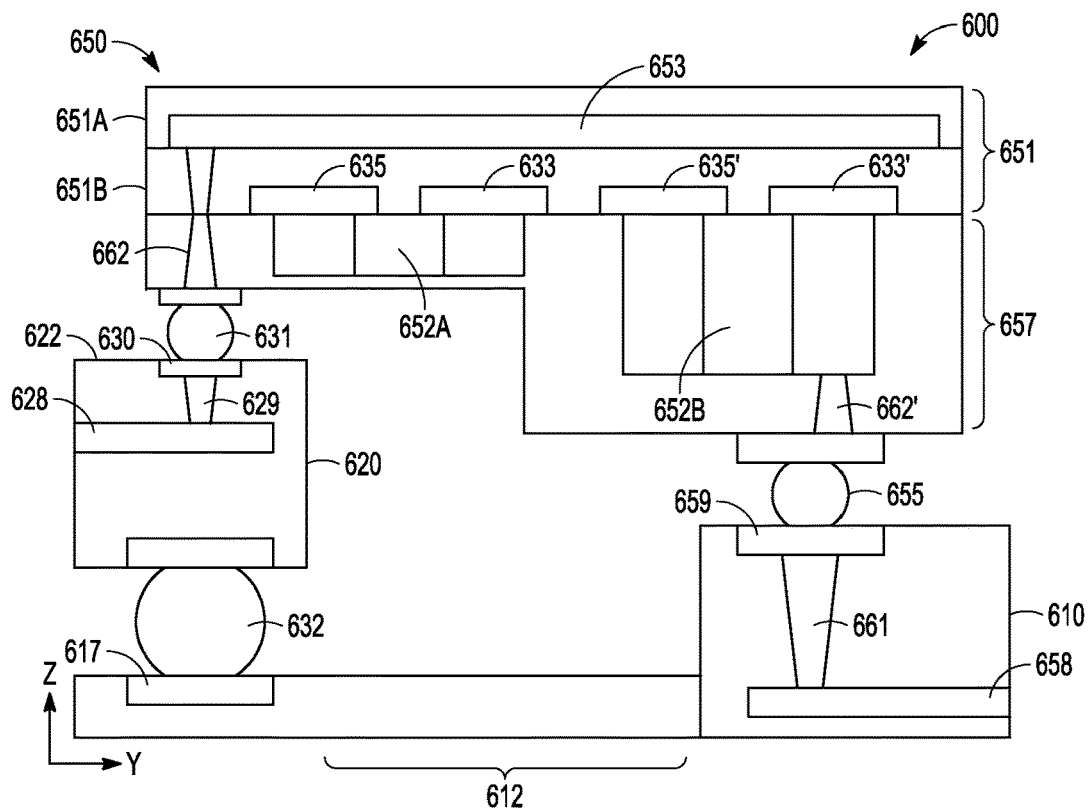
FIG. 6 is a schematic diagram of a package to board molded lateral interconnect in accordance with some example embodiments.

FIG. 6 is a schematic diagram of a package to board molded lateral interconnect in accordance with some example embodiments.

Semiconductor assembly 600 includes package 620 with top side 622, package traces 628, package via 629, contact pad 630, solder ball 631, molded trace 653, bridge 650 with metallic layer stack 651 (with layers 651a, 651b), capacitors 652a, 652b, and molded layer 657, PCB 610, contact pad 659, solder ball 655, PCB via 661, and PCB trace 658. The components in assembly 600 are similar to, and connected in the same fashion, as the corresponding components discussed with reference to FIGS. 3A-3B and 4, except where otherwise noted.

In bridge 650 of assembly 600, molded layer 657 is flipped with metallic layer stack 651, so that molded layer 657 is closer to PCB 610 and package 620. Capacitors 652a, 652b, embedded in molded layer 657, are of differing thicknesses. In addition, the top planes of package 620 and PCB 610 are not even. For this reason, molded layer 657 is stepped to accommodate for the difference in thickness between capacitors 652a, 652b and difference in height between PCB 610 and package 620.

Vias 662, 662' can be used to electrically connect solder balls 631, 655, to metallic layer stack 651 or capacitors 652a, 652b. In some examples, via 662 can extend through molded layer 657 to directly couple to metallic layer stack 651. In some examples, via 662' extends only a portion of molded layer 657 to form contact with component disposed within molded layer 657, for example, capacitor 652b. Due to the stepped nature of molded layer 657, metallic layer stack 651 to maintain continuous thickness and host conductive traces 653 and/or connecting pads 633, 635, 633', 635'. This can allow for tailoring of the molded layer 657 according to the array of capacitors on or around the semiconductor die 640.

Figure 7:
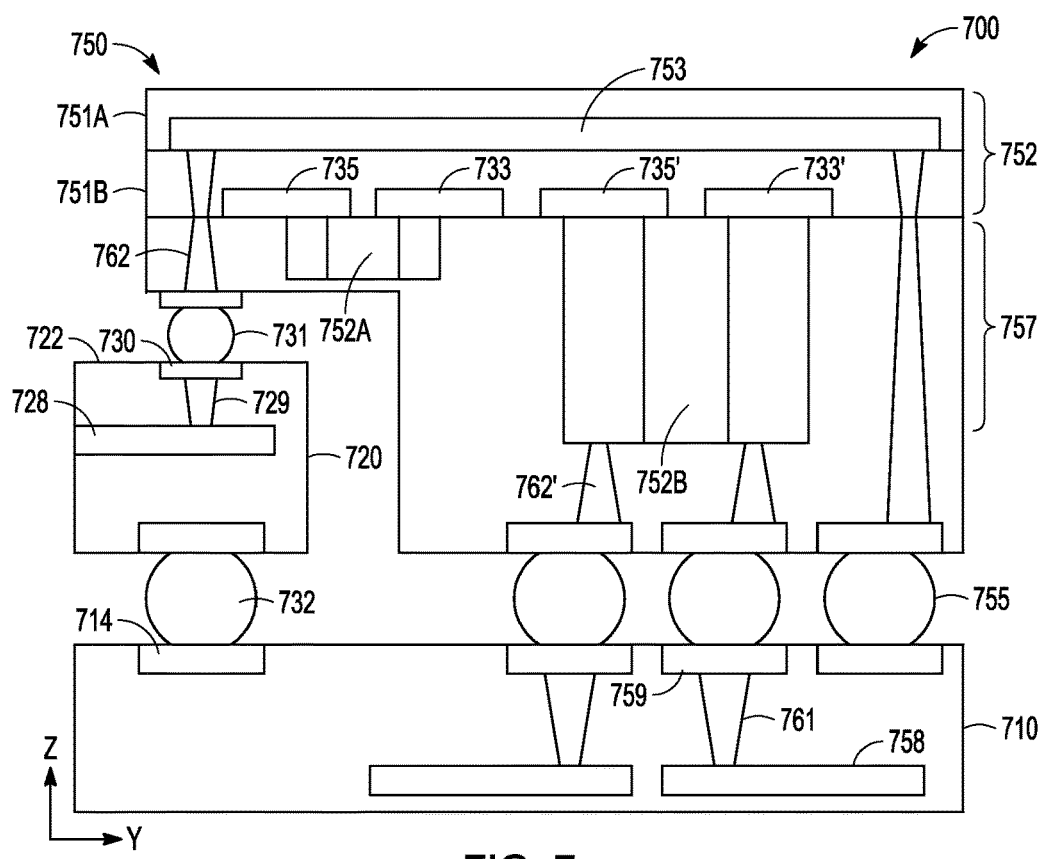
FIG. 7 is a schematic diagram of a package to board molded lateral interconnect in accordance with some example embodiments.

FIG. 7 is a schematic diagram of a package to board molded lateral interconnect in accordance with some example embodiments. Semiconductor assembly 700 includes package 720 with top side 722, package traces 728, package via 729, contact pad 730, solder ball 731, molded trace 753, bridge 750 with metallic layer stack 751 (with layers 751*a*, 751*b*), capacitors 752*a*, 752*b*, and molded layer 757, PCB 710, contact pad 759, solder ball 755, PCB via 761, and PCB trace 758. The components in assembly 700 are similar to, and connected in the same fashion, as the corresponding components discussed with reference to FIGS. 3A-3B, 4, and 6, except where otherwise noted.

Assembly 700 is similar to assembly 600 in that the molded layer 757 is "stepped" with varying heights. However, in assembly 700, package 720 is of higher height than PCB 710. Thus, the step built into molded layer 757 of assembly 700 is to accommodate the difference in height. In some examples, molded trace 753 can be coupled to capacitors 752*a*, 752*b* through micro-via (not shown) and connecting pads 733, 735, 733', 735'. In some examples, molded trace 753 is coupled to PCB 710 through via 762.

Figure 8:
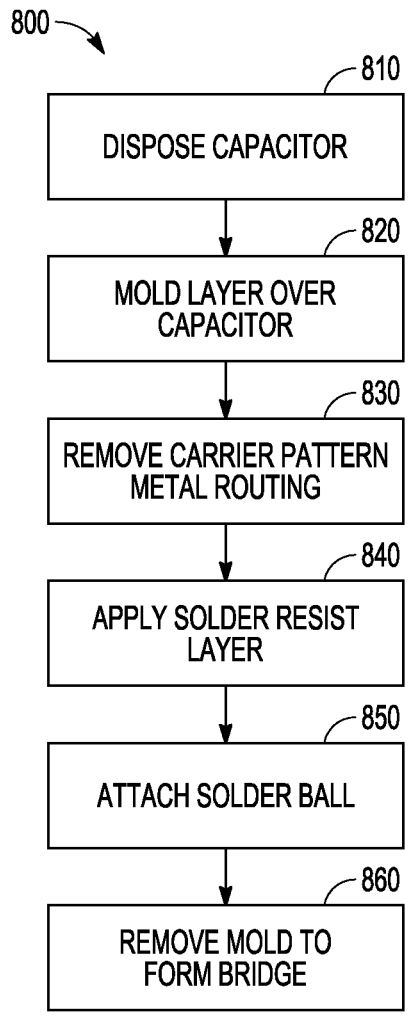
FIG. 8 shows a flow diagram of a method of manufacture of a semiconductor device in accordance with some example embodiments.

FIG. 8 shows a flow diagram of a method of manufacture of a semiconductor device in accordance with some example embodiments. Method 800 is an example, simple assembly flow to manufacture a recess by-pass bridge for package-to-PCB direct lateral interconnection.

Method 800 begins with disposing a capacitor on a carrier (step 810). The capacitor can be, for example, a decoupling capacitor with at least two terminals. Next, a layer is molded over the capacitor (step 820). This can be done, for example, by an injection or transfer molding process.

Next, in step 830, the carrier material is removed. Metallic routing and/or pads are patterned on the capacitor and the mold layer. This can be done through etching or electroplating processes. Subsequently, a dielectric layer (e.g., solder resist material) can be disposed over the routing/pads and partially removed to expose the routing/pads. This can be done, for example, by lamination or an etching process (step 840).

Next, in step 850, solder balls can be attached to the metallic pads/traces (i.e., at the exposed solder resist material portions). This can be done by, for example, vacuum pick-and-place or a solder reflow process. Finally, in step 860, the molded layer can be selectively removed to form the final shape of the bridge. This can be done by laser cutting, mechanical stamping, or similar processes.

A recess by-pass interconnect, such as the bridges discussed above, can be, for example, implemented in mobile devices which require smaller packaging form factors or thin platform Z-heights. These types of recess by-pass interconnects can allow for miniaturization while increasing performance and transmission data-rate or bandwidth.

Figure 9:
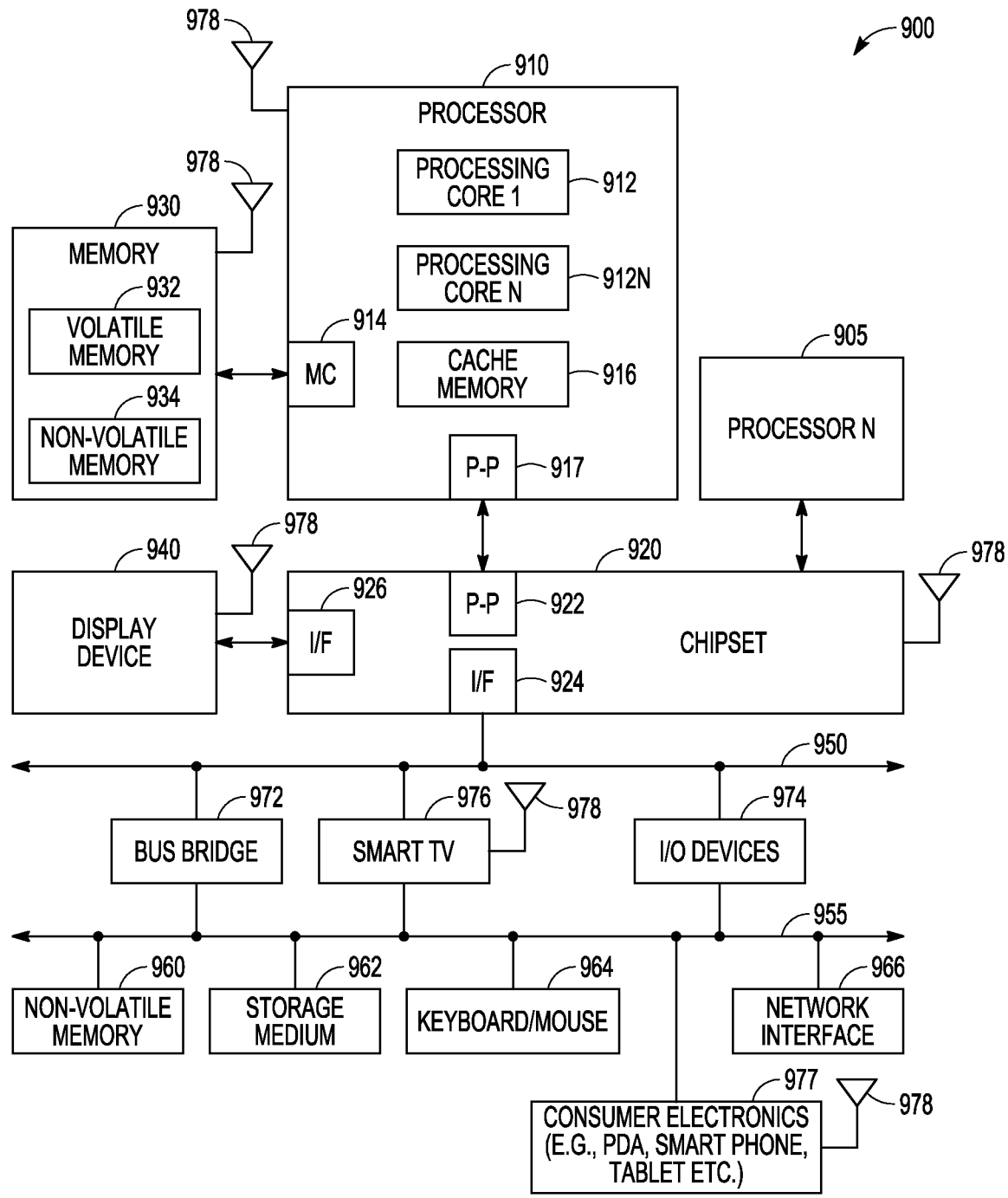
FIG. 9 shows a system that may incorporate a semiconductor device and methods, in accordance with some example embodiments.

FIG. 9 illustrates a system level diagram, depicting an example of an electronic device (e.g., system) that may include an assembly with a recess by-pass bridge interconnect and/or methods described above. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 includes a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, non-volatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, non-volatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

To better illustrate the method and apparatuses disclosed herein, a non-limiting list of embodiments is provided here:

Example 1 includes a semiconductor device includes a circuit board comprising a recess, a package in the recess, a semiconductor die coupled to the first side of the package, and a bridge extending from the first side of the package to the circuit board, wherein the bridge electrically couples the package to the circuit board. The package includes a first side, and a second side.

Example 2 includes Example 1, further comprising a component on the circuit board, wherein the bridge electrically couples the package to the component.

Example 3 includes any of Examples 1-2, wherein the component is a memory device, a connector, a voltage regulator, an inductor, a resistor, or a processing device.

Example 4 includes any of Examples 1-3, wherein the bridge comprises at least one decoupling capacitor.

Example 5 includes any of Examples 1-4, wherein the at least one decoupling capacitor includes a first terminal coupled to the first side of the package and a second terminal coupled to the circuit board.

Example 6 includes any of Examples 1-1, wherein the bridge includes a mold layer and a metallic layer thereon.

Example 7 includes any of Examples 1-6, wherein the mold layer comprises at least one capacitor.

Example 8 includes any of Examples 1-6, wherein the conductive layer further comprises one or more routing traces.

Example 9 includes any of Examples 1-6, wherein the bridge further comprises a component mounted on the conductive layer and residing in the recess, and wherein the component is coupled to one or more routing traces.

Example 10 includes any of Examples 1-9, wherein the component comprises a memory device or a transceiver device.

Example 11 includes any of Examples 1-6, wherein the metallic layer includes a first dielectric layer, a second dielectric layer, a routing trace therebetween, the routing trace electrically connected to the package and the circuit board, and first and second contact pads embedded in the first dielectric layer.

Example 12 includes any of Examples 1-1, wherein the bridge comprises a molded frame at least partially encircling the semiconductor die.

Example 13 includes any of Examples 1-1, wherein the bridge comprises a plurality of decoupling capacitors of varying heights Example 14 includes any of Examples 1-13, wherein the bridge comprises one or more steps.

Example 15 includes any of Examples 1-1, wherein the bridge lies in the same plane as the first surface of the package and the printed circuit board.

Example 16 includes a semiconductor device including a printed circuit board having a first height, a component mounted on the printed circuit board, a package mounted on the printed circuit board, the package having a second height different than the first height, a semiconductor die mounted on the package, and an interconnect electrically mounted on the package and the printed circuit board, wherein the interconnect electrically couples the semiconductor die to the component.

Example 17 includes Examples 16, wherein the interconnect comprises a molded layer and a metallic layer.

Example 18 includes any of Examples 16-17, wherein the molded layer comprises a first portion having a first thickness and a second portion having a second thickness, wherein the first thickness is different than the second thickness.

Example 19 includes any of Examples 16-18, wherein each of the first and second portions comprise a capacitor or a molded trace.

Example 20 includes a system includes a semiconductor device, a touchscreen connected to the device, and a housing surrounding the device. The semiconductor device includes a circuit board, a semiconductor die coupled to the first side of the package, and a bridge extending from the first side of the package to the circuit board, wherein the bridge electrically connects the package to the circuit board. The package includes a first side, a second side, and a plurality of solder balls on the second side, wherein the package is attached to the circuit board through the plurality of solder balls.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor device comprising:
   a circuit board comprising a recess;
   a package in the recess, the package comprising:
   a first side; and
   a second side;
   a semiconductor die coupled to the first side of the package; and
   a bridge extending from the first side of the package to the circuit board, wherein the bridge electrically couples the package to the circuit board, and wherein the bridge comprises a mold layer and a conductive layer thereon, and the mold layer comprises at least one decoupling capacitor,
   wherein the bridge comprises at least one decoupling capacitor comprising a first terminal coupled to the first side of the package and a second terminal coupled to the circuit board.

2. The device of claim 1, further comprising a component on the circuit board, wherein the bridge electrically couples the package to the component.

3. The device of claim 1wherein the conductive layer further comprises one or more routing traces.

4. The device of claim 1, wherein the bridge further comprises a component mounted on the conductive layer and residing in the recess.

5. The device of claim 1, wherein the bridge further comprises:
   a first dielectric layer;
   a second dielectric layer;
   a routing trace therebetween, the routing trace electrically connected to the package and the circuit board; and
   first and second contact pads embedded in the first dielectric layer.

6. The device of claim 1, further comprising a molded frame at least partially encircling the semiconductor die.

7. The device of claim 1, wherein the bridge comprises a plurality of decoupling capacitors of varying heights.

8. The device of claim 1, wherein the bridge lies in the same plane as the first surface of the package and the printed circuit board.

9. A semiconductor device comprising:
   a circuit board comprising a recess;
   a package in the recess, the package comprising:
   a first side; and
   a second side;
   a semiconductor die coupled to the first side of the package; and
   a bridge extending from the first side of the package to the circuit board, wherein the bridge electrically couples the package to the circuit board, and wherein the bridge comprises a mold layer and a conductive layer thereon, and the mold layer comprises at least one decoupling capacitor, wherein the bridge comprises a plurality of decoupling capacitors of varying heights, and wherein the bridge comprises one or more steps.

10. A semiconductor device comprising:

a printed circuit board having a first height;

a component mounted on the printed circuit board;

a package mounted on the printed circuit board, the package having a second height different than the first height;

a semiconductor die mounted on the package; and an interconnect electrically mounted on the package and the printed circuit board, wherein the interconnect electrically couples the semiconductor die to the component, wherein the interconnect comprises a molded layer and a conductive layer, the molded layer comprising:

a first portion having a first thickness; and a second portion having a second thickness, wherein the first thickness is different than the second thickness, and wherein at least one of the first and second portions comprises a decoupling capacitor.

11. The device of claim 10, wherein each of the first and second portions comprise the capacitor or the conductive trace.

* * * * *

UNITED STATES PATENT AND TRADEMARK OFFICE
CERTIFICATE OF CORRECTION

PATENT NO. : 11,482,481 B2
APPLICATION NO. : 16/888155
DATED : October 25, 2022
INVENTOR(S) : Cheah et al.

It is certified that error appears in the above-identified patent and that said Letters Patent is hereby corrected as shown below:

In the Claims

In Column 12, Line 35, in Claim 3, delete "claim lwherein" and insert --claim 1, wherein-- therefor Signed and Sealed this
Twenty-second Day of August, 2023

Katherine Kelly Vidal
*Director of the United States Patent and Trademark Office*